(12) United States Patent
Liao et al.

(10) Patent No.: US 10,658,366 B2
(45) Date of Patent: May 19, 2020

(54) SEMICONDUCTOR DEVICE AND METHOD FOR FABRICATING THE SAME

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Chia-Liang Liao, Yunlin County (TW); Feng-Yi Chang, Tainan (TW); Fu-Che Lee, Taichung (TW); Chieh-Te Chen, Kaohsiung (TW); Yi-Wang Zhan, Taichung (TW)

(73) Assignees: UNITED MICROELECTRONICS CORP., Hsin-Chu (TW); Fujian Jinhua Integrated Circuit Co., Ltd., Quanzhou, Fujian Province (KR)

( * ) Notice: Subject to any disclaimer, the term of this patent is extended or adjusted under 35 U.S.C. 154(b) by 0 days.

(21) Appl. No.: 15/920,468

(22) Filed: Mar. 14, 2018

(65) Prior Publication Data
US 2018/0315759 A1 Nov. 1, 2018

(30) Foreign Application Priority Data
Apr. 28, 2017 (CN) .......................... 2017 1 0292085

(51) Int. Cl.
*H01L 27/108* (2006.01)
*H01L 21/768* (2006.01)
(Continued)

(52) U.S. Cl.
CPC .. *H01L 27/10855* (2013.01); *H01L 21/31116* (2013.01); *H01L 21/7687* (2013.01); *H01L 21/76805* (2013.01); *H01L 21/76816* (2013.01); *H01L 21/76877* (2013.01); *H01L 21/76895* (2013.01); *H01L 23/5226* (2013.01); *H01L 23/535* (2013.01); *H01L 23/53257* (2013.01); *H01L 23/53223* (2013.01); *H01L 23/53238* (2013.01); *H01L 23/53266* (2013.01); *H01L 27/10814* (2013.01)

(58) Field of Classification Search
CPC ......... H01L 27/10855; H01L 27/10814; H01L 21/7687; H01L 21/31116; H01L 21/76805; H01L 21/76895; H01L 23/53257; H01L 23/535
See application file for complete search history.

(56) References Cited

U.S. PATENT DOCUMENTS 5,364,817 A 11/1994 Lur et al.
5,821,141 A 10/1998 Huang
(Continued)

*Primary Examiner* — Stephen M Bradley
*Assistant Examiner* — Wasiul Haider
(74) *Attorney, Agent, or Firm* — Winston Hsu

(57) ABSTRACT

A method for fabricating semiconductor device includes the steps of: providing a material layer having a contact pad therein; forming a dielectric layer on the material layer and the contact pad; forming a doped oxide layer on the dielectric layer; forming an oxide layer on the doped oxide layer; performing a first etching process to remove part of the oxide layer, part of the doped oxide layer, and part of the dielectric layer to form a first contact hole; performing a second etching process to remove part of the doped oxide layer to form a second contact hole; and forming a conductive layer in the second contact hole to form a contact plug.

19 Claims, 2 Drawing Sheets

(51) Int. Cl.
    *H01L 23/535*     (2006.01)
    *H01L 21/311*     (2006.01)
    *H01L 23/532*     (2006.01)
    *H01L 23/522*     (2006.01)

(56) References Cited

U.S. PATENT DOCUMENTS

| | | | |
|---|---|---|---|
| 6,127,260 A | 10/2000 | Huang | |
| 6,436,844 B2 * | 8/2002 | Becker | H01L 27/76897 |
| | | | 257/E21.507 |
| 2008/0014699 A1 * | 1/2008 | Torek | H01L 29/66795 |
| | | | 438/257 |
| 2008/0124886 A1 * | 5/2008 | Lin | H01L 27/10855 |
| | | | 438/386 |
| 2008/0211002 A1 * | 9/2008 | Nakamura | H01L 27/10852 |
| | | | 257/303 |
| 2008/0217790 A1 * | 9/2008 | Hasunuma | H01L 21/76804 |
| | | | 257/774 |
| 2010/0240191 A1 * | 9/2010 | Chung | H01L 27/10814 |
| | | | 438/386 |
| 2011/0306208 A1 * | 12/2011 | Lee | H01L 28/91 |
| | | | 438/675 |
| 2013/0082231 A1 * | 4/2013 | Tada | G11C 13/0007 |
| | | | 257/4 |
| 2017/0053872 A1 * | 2/2017 | Lee | H01L 23/5384 |
| 2017/0229552 A1 * | 8/2017 | Fujita | H01L 21/76895 |

\* cited by examiner

SEMICONDUCTOR DEVICE AND METHOD FOR FABRICATING THE SAME

BACKGROUND OF THE INVENTION

1. Field of the Invention

The invention relates to a method for fabricating semiconductor device, and more particularly, to a method of forming contact plugs within a dynamic random access memory (DRAM) cell.

2. Description of the Prior Art

As electronic products develop toward the direction of miniaturization, the design of dynamic random access memory (DRAM) units also moves toward the direction of higher integration and higher density. Since the nature of a DRAM unit with buried gate structures has the advantage of possessing longer carrier channel length within a semiconductor substrate thereby reducing capacitor leakage, it has been gradually used to replace conventional DRAM unit with planar gate structures.

Typically, a DRAM unit with buried gate structure includes a transistor device and a charge storage element to receive electrical signals from bit lines and word lines. Nevertheless, current DRAM units with buried gate structures still pose numerous problems due to limited fabrication capability. Hence, how to effectively improve the performance and reliability of current DRAM device has become an important task in this field.

SUMMARY OF THE INVENTION

According to an embodiment of the present invention, a method for fabricating semiconductor device includes the steps of: providing a material layer having a contact pad therein; forming a dielectric layer on the material layer and the contact pad; forming a doped oxide layer on the dielectric layer; forming an oxide layer on the doped oxide layer; performing a first etching process to remove part of the oxide layer, part of the doped oxide layer, and part of the dielectric layer to form a first contact hole; performing a second etching process to remove part of the doped oxide layer to form a second contact hole; and forming a conductive layer in the second contact hole to form a contact plug.

According to another aspect of the present invention, a semiconductor device includes: a contact pad in a material layer; a dielectric layer on the material layer and the contact pad; a doped oxide layer on the dielectric layer; an oxide layer on the doped oxide layer; and a contact plug comprising a first portion in the dielectric layer, a second portion in the doped oxide layer, and a third portion in the oxide layer, wherein the second portion comprises an air gap.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
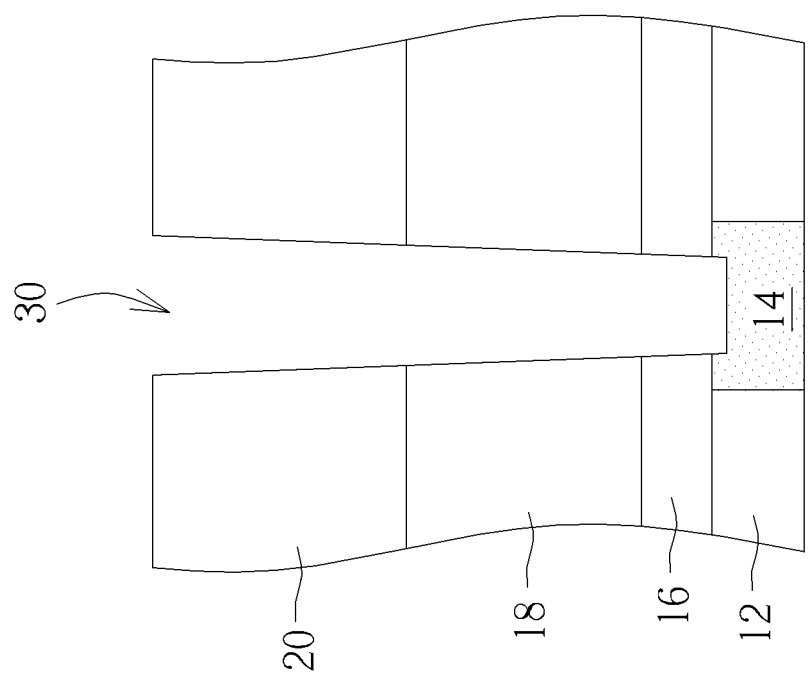

Referring to FIGS. 1-4, FIGS. 1-4 illustrate a method for fabricating semiconductor device according to an embodiment of the present invention. As shown in FIG. 1, a material layer 12 and a contact pad 14 embedded in the material layer 12 are first provided, in which the material layer 12 could be disposed on a semiconductor substrate (not shown) and conductive elements including but not limited to for example gate structure, source/drain regions could be formed within the material layer 12. In this embodiment, the material layer 12 is preferably an interlayer dielectric (ILD) layer disposed on top of word lines within a DRAM cell, in which the material layer 12 could include single-layered or multi-layered insulating material including but not limited to for example silicon oxide, silicon nitride, silicon oxynitride (SiON), or combination thereof. The contact pad 14 could be a storage node pad or capacitor contact pad used to electrically connect capacitors within the DRAM cell.

Next, a dielectric layer 16 is formed on the material layer 12 and the contact pad 14, a doped oxide layer 18 is formed on the dielectric layer 16, and an oxide layer 12 is formed on the doped oxide layer 18. In this embodiment, the dielectric layer 16 is preferably made of silicon nitride, the doped oxide layer 18 is preferably made of borosilicate phosphosilicate glass (BPSG) or phosphosilicate glass (PSG), and the oxide layer 20 is preferably made of tetraethyl orthosilicate (TEOS).

It should be noted that even though the doped oxide layer 18 is disposed directly on the surface of the dielectric layer 16, it would also be desirable to form a high-k dielectric layer (not shown) between the dielectric layer 16 and the doped oxide layer 18 according to an embodiment of the present invention. Preferably, the high-k dielectric layer is selected from dielectric materials having dielectric constant (k value) larger than 4. For instance, the high-k dielectric layer may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

Next, a photo-etching process is conducted to form a contact hole in the oxide layer 20, the doped oxide layer 18, and the dielectric layer 16. Specifically, it would be desirable to sequentially form an amorphous carbon film or advanced patterning film (APF) 22, a dielectric anti-reflective coating (DARC) 24, a bottom anti-reflective coating (BARC) 26, and a patterned resist 28 on the oxide layer 20.

Figure 2:
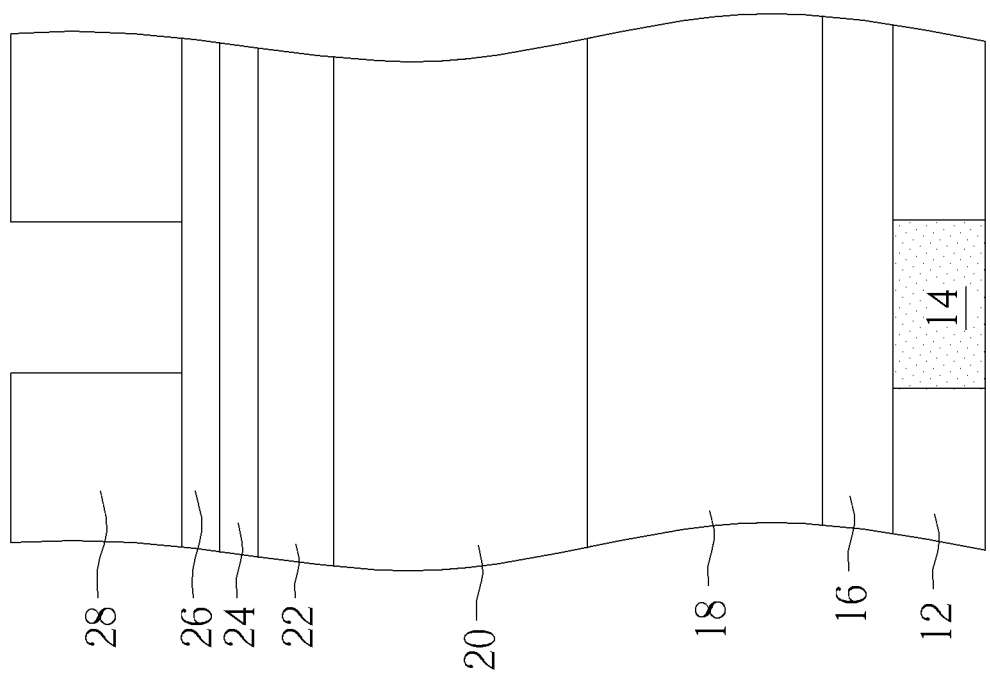
FIGS. 1-4 illustrate a method for fabricating semiconductor device according to an embodiment of the present invention.

Next, the patterned resist 28 is first used as mask to remove part of the BARC 26, part of the DARC 24, and part of the APF 22, and after removing the patterned resist 28, an etching process is conducted by using the patterned BARC 26, the DARC 24, and the APF 22 as mask to remove part of the oxide layer 20, part of the doped oxide layer 18, and part of the dielectric layer 16 to form a first contact hole 30 exposing the surface of the contact pad 14 within the material layer 12. Next, as shown in FIG. 2, the BARC 26, the DARC 24, and the APF 22 are removed to expose the surface of the oxide layer 20.

Figure 3:
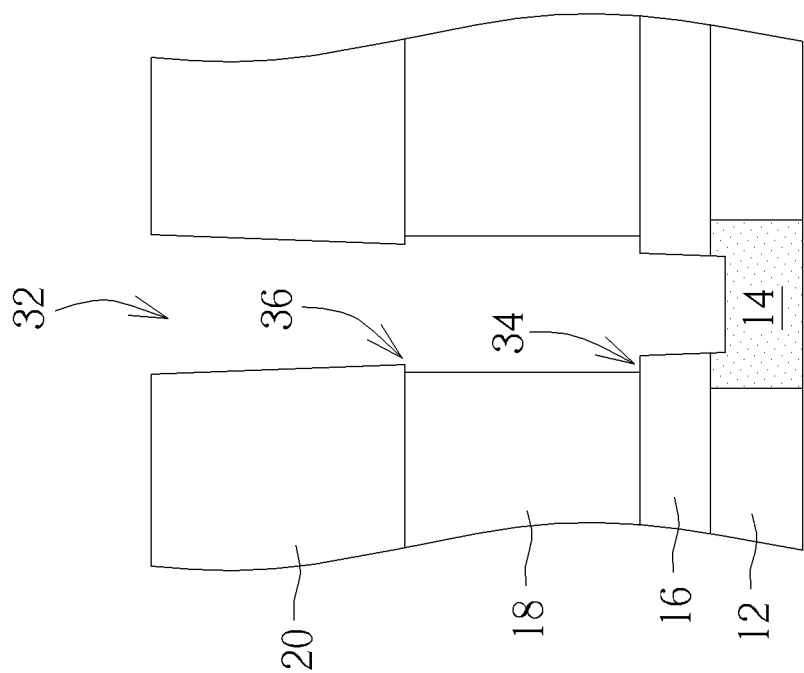

Next, as shown in FIG. 3, another etching process is conducted to remove part of the doped oxide layer 18 to form a second contact hole 32. Specifically, the etching process conducted at this stage is a soft etching process, which preferably uses a gas selected from the group consisting of ammonia ($NH_3$) and nitrogen trifluoride ($NF_3$) to only remove part of the doped oxide layer 18 without damaging or removing any of the oxide layer 20 and the dielectric layer 16. Preferably, the contact hole in the original doped oxide layer 18 is expanded so that the first contact hole 30 originally having inclined and planar sidewalls is transformed into a second contact hole 32 having sidewalls having step shaped profiles or step portions. In this embodiment, an etching selectivity of the doped oxide layer 18 to the oxide layer 20 during the removal of part of the doped oxide layer 18 and formation of the second contact hole 32 is preferably between 50:1 to 250:1 or more preferably at 200:1.

Viewing from a more detailed perspective, since the etching process conducted at this stage only removes part of the doped oxide layer 18, a first step portion 34 is preferably formed between the doped oxide layer 18 and the dielectric layer 16 and a second step portion 36 is formed between the doped oxide layer 18 and the oxide layer 20 after the contact hole within the doped oxide layer 18 is expanded.

Figure 4:
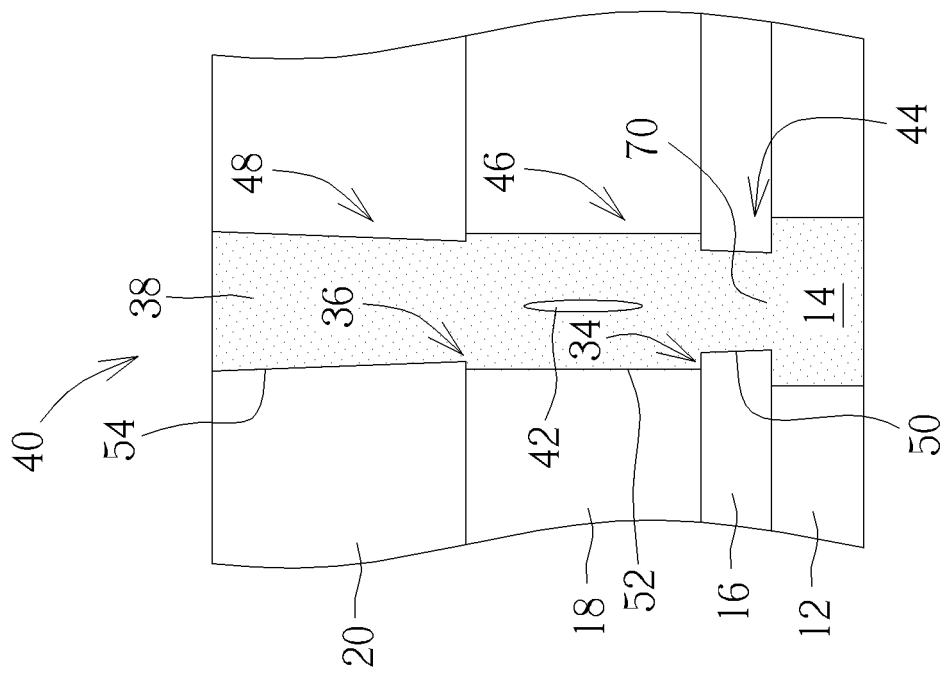

Next, as shown in FIG. 4, a conductive layer 38 is formed into the second contact hole 32 to form a contact plug 40 and at the same time form an air gap 42 in the contact plug 40. Specifically, the formation of the contact plug 40 could be accomplished by sequentially forming a selective barrier layer (not shown) and a conductive layer 38 in the second contact hole 32, and a planarizing process such as chemical mechanical polishing (CMP) process is conducted to remove part of the conductive layer 38, part of the barrier layer, and even part of the oxide layer 20 so that the top surface of the remaining conductive layer 38 is even with the top surface of the oxide layer 20. Since the etching rate is faster in the doped oxide layer 18 during the aforementioned etching process for forming the second contact hole 32 thereby expanding the doped oxide layer 18, the air gap 42 is preferably formed in the part of the contact plug 40 within the doped oxide layer 18. In this embodiment, the barrier layer of the contact plug 40 could include TiN, TaN, or combination thereof and the conductive layer 38 could include Al, Cr, Cu, Ta, Mo, W, or combination thereof.

Referring again to FIG. 4, which further illustrates a structural view of a semiconductor device according to an embodiment of the present invention. As shown in FIG. 4, the semiconductor device preferably includes a contact pad 14 in a material layer 12, a dielectric layer 16 disposed on the material layer 12 and the contact pad 14, a doped oxide layer 18 disposed on the dielectric layer 16, an oxide layer 20 disposed on the doped oxide layer 18, and a contact plug 40 disposed in the dielectric layer 16, the doped oxide layer 18, and the oxide layer 20. Preferably, the contact plug 40 further includes a first portion 44 in the dielectric layer 16, a second portion 46 in the doped oxide layer 18, and a third portion 48 in the oxide layer 20 and an air gap 42 is disposed in the second portion 46.

In this embodiment, the dielectric layer 16 is preferably made of silicon nitride, the doped oxide layer 18 is preferably made of borosilicate phosphosilicate glass (BPSG) or phosphosilicate glass (PSG), and the oxide layer 20 is preferably made of tetraethyl orthosilicate (TEOS), but not limited thereto.

Structurally, a first step portion 34 is formed on the edge contacted by the doped oxide layer 18 and the dielectric layer 16 and a second step portion 36 is formed on the edge contacted by the doped oxide layer 18 and the oxide layer 20. The first portion 44 of the contact plug 40 includes a first inclined sidewall 50, the second portion 46 includes a vertical sidewall 52, and the third portion 48 includes a second inclined sidewall 54. Preferably, a bottom surface of the first portion 44 is around 70 nm, the width of the second portion 46 is between 90 nm to 120 nm, the top surface of the third portion 48 is about 160 nm, the thickness of the dielectric layer 16 is about 21 nm, the thickness of the doped oxide layer 18 is about 500 nm to 5000 nm, and the thickness of the oxide layer 20 is about 8000 nm.

Overall, the present invention preferably forms a doped oxide layer made of BPSG or PSG between the oxide layer and the dielectric layer and then increases the etching selectivity for the doped oxide layer during the formation of contact hole so that the size of particular portion of the contact hole within the doped oxide layer could be expanded substantially. By doing so, it would be desirable to improve the success rate and efficiency of filling conductive materials into the contact hole and also facilitate the formation of air gap within the conductive materials to strengthen the entire contact plug structure.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
   providing a material layer having a contact pad therein;
   forming a dielectric layer on the material layer and the contact pad;
   forming a doped oxide layer on the dielectric layer;
   forming an oxide layer on the doped oxide layer;
   performing a first etching process to remove part of the oxide layer, part of the doped oxide layer, and part of the dielectric layer to form a first contact hole;
   performing a second etching process to remove part of the doped oxide layer to form a second contact hole after removing part of the dielectric layer and exposing the contact pad; and
   forming a conductive layer in the second contact hole to form a contact plug.

2. The method of claim 1, wherein the dielectric layer comprises silicon nitride.

3. The method of claim 1, wherein the doped oxide layer comprises borosilicate phosphosilicate glass (BPSG) or phosphosilicate glass (PSG).

4. The method of claim 1, wherein the oxide layer comprises tetraethyl orthosilicate (TEOS).

5. The method of claim 1, wherein the second etching process uses a gas selected from the group consisting of ammonia ($NH_3$) and nitrogen trifluoride ($NF_3$).

6. The method of claim 1, wherein an etching selectivity of the doped oxide layer to the oxide layer is 200:1.

7. The method of claim 1, further comprising a first step portion between the doped oxide layer and the dielectric layer.

8. The method of claim 1, further comprising a second step portion between the doped oxide layer and the oxide layer.

9. The method of claim 1, wherein the contact plug comprises tungsten.

10. The method of claim 1, wherein the contact plug comprises a first portion in the dielectric layer, a second portion in the doped oxide layer, and a third portion in the oxide layer.

11. The method of claim 10, wherein the first portion comprises a first inclined sidewall, the second portion comprises a vertical sidewall, and the third portion comprises a second inclined sidewall.

12. The method of claim 10, further comprising an air gap in the second portion.

13. A semiconductor device, comprising:
a contact pad in a material layer;
a dielectric layer on the material layer and the contact pad;
a doped oxide layer on the dielectric layer;
an oxide layer on the doped oxide layer; and
a contact plug comprising a first portion in the dielectric layer, a second portion in the doped oxide layer, and a third portion in the oxide layer, wherein the second portion comprises an air gap in the doped oxide layer and a top surface of the air gap is lower than a top surface of the doped oxide layer.

14. The semiconductor device of claim 13, wherein the dielectric layer comprises silicon nitride.

15. The semiconductor device of claim 13, wherein the doped oxide layer comprises borosilicate phosphosilicate glass (BPSG) or phosphosilicate glass (PSG).

16. The semiconductor device of claim 13, wherein the oxide layer comprises tetraethyl orthosilicate (TEOS).

17. The semiconductor device of claim 13, further comprising a first step portion between the doped oxide layer and the dielectric layer.

18. The semiconductor device of claim 13, further comprising a second step portion between the doped oxide layer and the oxide layer.

19. The semiconductor device of claim 13, wherein the first portion comprises a first inclined sidewall, the second portion comprises a vertical sidewall, and the third portion comprises a second inclined sidewall.

* * * * *

UNITED STATES PATENT AND TRADEMARK OFFICE
CERTIFICATE OF CORRECTION

PATENT NO. : 10,658,366 B2
APPLICATION NO. : 15/920468
DATED : May 19, 2020
INVENTOR(S) : Chia-Liang Liao et al.

It is certified that error appears in the above-identified patent and that said Letters Patent is hereby corrected as shown below:

On the Title Page

Item (73), correct the address (country) of the 2nd assignee, "Fujian Jinhua Integrated Circuit Co., Ltd., from "Quanzhou, Fujian Province (KR)" to --Quanzhou, Fujian Province (CN)--.

Signed and Sealed this
Twenty-eighth Day of July, 2020

Andrei Iancu
*Director of the United States Patent and Trademark Office*